(12) United States Patent
Ito

(10) Patent No.: US 6,656,853 B2
(45) Date of Patent: Dec. 2, 2003

(54) ENHANCED DEPOSITION CONTROL IN FABRICATING DEVICES IN A SEMICONDUCTOR WAFER

(75) Inventor: Shinya Ito, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/025,469

(22) Filed: Dec. 26, 2001

(65) Prior Publication Data

US 2002/0081794 A1 Jun. 27, 2002

(30) Foreign Application Priority Data

Dec. 26, 2000 (JP) .......................................... 2000-394803

(51) Int. Cl.[7] .............................................. H01L 21/31
(52) U.S. Cl. ...................................................... 438/778
(58) Field of Search ................................. 438/778, 769

(56) References Cited

U.S. PATENT DOCUMENTS

| 5,094,966 A | 3/1992 | Yamazaki |
| 5,629,043 A | * 5/1997 | Inaba et al. .................... 427/79 |
| 5,932,286 A | 8/1999 | Beinglass et al. |
| 5,997,757 A | 12/1999 | Nagayama et al. |
| 6,060,393 A | 5/2000 | Ngo et al. |
| 6,348,420 B1 | * 2/2002 | Raaijmakers et al. ....... 438/769 |

FOREIGN PATENT DOCUMENTS

| EP | 0 104 658 A1 | 4/1984 |
| JP | A 62-263643 | 11/1987 |
| WO | 94/18353 | 8/1994 |
| WO | 99/285529 | 6/1999 |
| WO | 01/04376 A1 | 1/2001 |

* cited by examiner

*Primary Examiner*—David Nelms
*Assistant Examiner*—Thao P Le
(74) *Attorney, Agent, or Firm*—Young & Thompson

(57) ABSTRACT

A method for an enhanced deposition control includes forming a transistor on a substrate of a semiconductor wafer, and depositing a silicon nitride layer on the transistor and the substrate in a reactor at a pressure of at least approximately $10^4$ Pa.

7 Claims, 9 Drawing Sheets

ENHANCED DEPOSITION CONTROL IN FABRICATING DEVICES IN A SEMICONDUCTOR WAFER

BACKGROUND OF THE INVENTION

1. Field of the Invention

The present invention relates to a method for an enhanced deposition control in fabricating devices in a semiconductor wafer.

2. Description of the Related Art

A continuing trend in semiconductor technology is to build integrated circuits with more and/or faster semiconductor devices. The drive toward this ultra large-scale integration has resulted in continued shrinking of device and circuit features. Among such trend, fabrication of semiconductor devices involves deposition of a silicon nitride layer over a semiconductor wafer to protect underlying structure.

Various deposition techniques of a silicon nitride layer are known. One such technique is disclosed in U.S. Pat. No. 6,060,393 wherein a silicon oxynitride layer is deposited using plasma enhanced chemical vapor deposition (PECVD) process and used as an etch-stop layer for a local interconnect. Another technique is disclosed in U.S. Pat. No. 5,997,757 wherein a silicon nitride layer is deposited using low-pressure chemical vapor deposition (LPCVD) process over 1 hour.

SUMMARY OF THE INVENTION

An object of the present invention is to provide a method for enhanced deposition control over the prior art deposition techniques of silicon nitride layer in terms of time and/or improving electron mobility within underlying structure.

According to the present invention, there is provided a method for an enhanced deposition control, which comprises forming at least one device within a substrate of a semiconductor wafer, and depositing a silicon nitride layer over the wafer in a reactor at a pressure of at least approximately $10^4$ Pa.

BRIEF DESCRIPTION OF THE DRAWINGS

The foregoing and other objects, features and advantages of the invention will be apparent from the following more particular description of exemplary embodiments of the invention as illustrated in the accompanying drawings. The drawings are not necessarily scale, emphasis instead being placed upon illustrating the principles of the invention.

DESCRIPTION OF THE EMBODIMENTS

The process steps and structures described below do not form a complete process flow for fabricating integrated circuits in a semiconductor wafer. The present invention can be practiced in conjunction with integrated circuit fabrication techniques currently used in the art, and only so much of the commonly practiced process steps are included as are necessary for an understanding of the present invention. The figures representing cross sections of portions of a device during fabrication are not drawn to scale, but instead are drawn to illustrate the features of the present invention.

In accordance with an exemplary embodiment of the present invention, there is provided an enhanced deposition process for use in fabricating a dual-layer dielectric in a manner to improve performance of the underlying device or devices. The dual-layer dielectric includes a silicon nitride layer 9 and an overlying dielectric layer 10 (see FIG. 1C). For example, the dual-layer dielectric includes a thick dielectric layer 10 over a thin silicon nitride layer 9. In accordance with embodiments of the present invention, the deposition pressure, which is monitored and controlled during the deposition of silicon nitride layer 9, has been maintained at least approximately $10^4$ Pa.

Figure 1A:
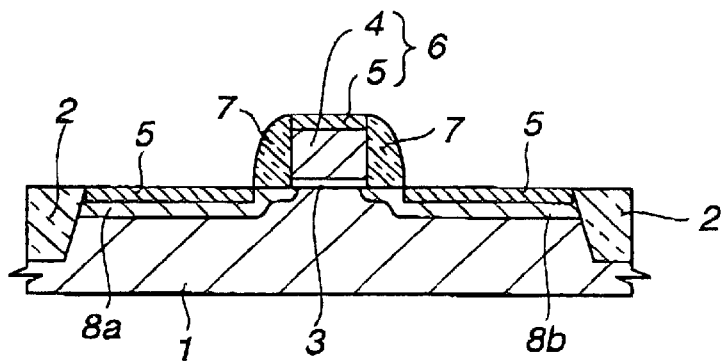
FIGS. 1A to 1C depict a cross section of a portion of a semiconductor wafer during the formation of a silicon nitride layer using an enhanced deposition control and then an overlying dielectric layer.

FIG. 1A depicts a cross-section of a portion of a semiconductor wafer before forming dual-layer dielectric including silicon nitride layer 9. As shown, the portion includes a silicon substrate 1 in which one or more devices have been formed. Within substrate 1 is formed a field oxide region 2 used to isolate the devices. The portion also includes a gate 6 that is part of a metal-oxide-semiconductor field effect transistor (MOSFET) having a source region 8a and a drain region 8b formed within substrate 1. As shown, gate 6 is formed on a gate oxide layer 3 under which a channel is formed between source and drain regions 8a and 8b. Gate oxide layer 3 is formed on substrate 1. In an exemplary embodiment, gate oxide layer 3 is a film of silicon oxynitride ($SiO_xN_y$) having a thickness of 2 nm. Gate 6 includes a layer 4 of doped polycrystalline silicon (referred to hereinafter as polysilicon). In the embodiment, polysilicon layer 4 is approximately 150 nm thick, and gate 6 also includes an optional conductive silicide layer 5 formed on polysilicon layer 4. Further, in the embodiment, gate 6 has a gate length Lg of 0.1 μm. The gate length Lg is the dimension of gate 6 measured in a direction in which source and drain regions 8a and 8b are separated from each other across the channel.

Oxide spacers 7 of, for example, silicon dioxide ($SiO_2$), are formed on the vertical side surfaces or walls of gate 6.

The materials of polysilicon layer 4 and silicide layer 5 are described. For an n-channel MOSFET (NMOSFET), polysilicon layer 4 is doped with a dopant of the n-type conductivity, such as, phosphorous and arsenic. For a p-channel MOSFET (PMOSFET), polysilicon layer 4 is doped with a dopant of the p-type conductivity, such as, boron. The doped ions are activated by a rapid-thermal-anneal (RTA) at a temperature of 1000° C. over 10 seconds. The material of silicide layer 5 includes cobalt silicide ($CoSi_2$) and nickel silicide ($NiSi_2$). Silicide layer 5 is also formed on the source and drain regions 8a and 8b. In other words, the top surface of gate 6, the surfaces of source and drain regions 8a and 8b are formed with silicide layer 5.

Figure 1B:
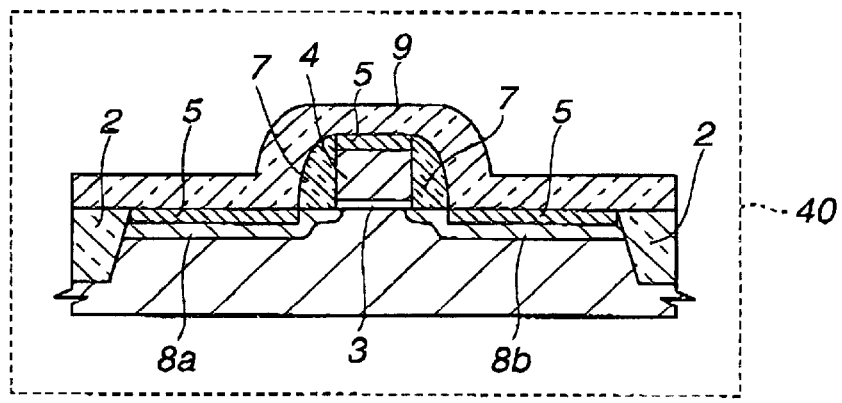

FIG. 1B depicts an exemplary cross-section of an improved portion of semiconductor wafer during the deposition of silicon nitride layer 9. Silicon nitride layer 9 includes dielectric material or materials including silicon nitride ($Si_xN_y$). In the embodiment, silicon nitride layer 9 is deposited within a reactor chamber, which is schematically indicated by dashed lines and reference numeral 40. Silicon nitride layer 9 is deposited over the entire surface of semiconductor wafer by a LPCVD process. The thickness of silicon nitride layer 9 is approximately 50 nm. In the deposition process within reactor chamber 40, the reactants including silane ($SiH_4$) and ammonia ($NH_3$) are applied by a flow into chamber 40. Molecular nitrogen ($N_2$) is used as carrier gas. Instead of molecular nitrogen ($N_2$), other inert gas, such as, helium (He) and argon (Ar) may be used as carrier gas. The ammonia ($NH_3$) flow rate is maintained greater than the silane ($SiH_4$) flow rate. A ratio of the ammonia ($NH_3$) flow rate to the silane ($SiH_4$) is not much exceeding 100 although ratios that vary from this value by plus approximately 30 percent or minus approximately 20 percent are suitable. In an exemplary embodiment, the silane ($SiH_4$) flow rates from 30 sccm to 50 sccm are suitable. The ammonia ($NH_3$) flow rates from 2000 sccm to 4000 sccm are suitable. The molecular nitrogen ($N_2$) flow rates from 2000 sccm to 7000 sccm are suitable. According to the embodiment, the deposited layer 9 of silicon nitride over gate 6 and oxide spacers 7 provides conformal step coverage. Step coverage is enhanced when pressure within reactor chamber 40 is maintained at approximately $4 \times 10^4$ Pa. In embodiments according to the present invention, pressures within reactor chamber 40 from $1 \times 10^4$ Pa to $6 \times 10^4$ Pa are suitable. Under this pressure condition, the deposition rate exceeds 50 nm/minute so that a silicon nitride layer 9 of 50 nm thick is deposited in less than 1 minute. In reactor chamber 40, temperatures range from 600° C. to 800° C.

Prior art LPCVD processes tend to maintain deposition pressures from 30 Pa to 250 Pa (see S. M. Sze "VLSI TECHNOLOGY" Second Edition, published in 1988 by McGraw-Hill Book Company). All these pressures are far lower than the pressure range from $1 \times 10^4$ Pa to $6 \times 10^4$ Pa according to embodiments of the present invention. The pressure range in embodiments of the present invention is 102 to 103 times as much as the deposition pressures used by the prior art LPCVD processes.

Figure 1C:
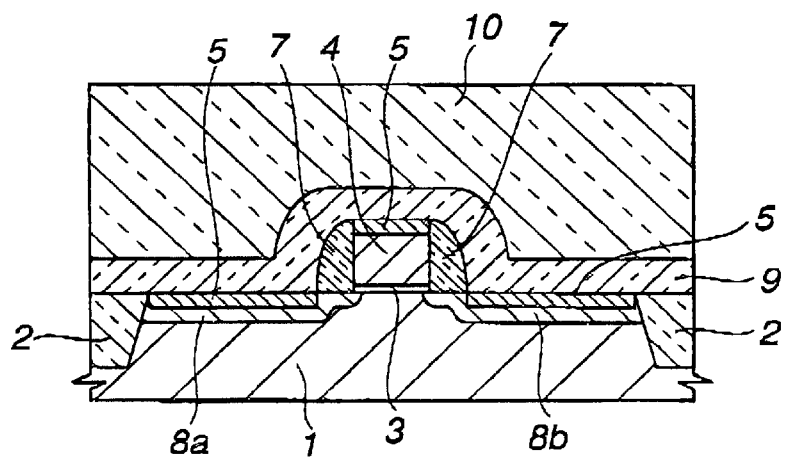

With reference to FIG. 1C, after the deposition of silicon nitride layer 9, a dielectric layer 10 is formed over silicon nitride layer 9. The dielectric layer 10 includes any suitable dielectric material or materials, including borophoshosilicate glass (BPSG) or any suitable silsesquioxane that includes hydrogen silsesquioxene, methyl silsesquioxane, methylated hydrogen silsesquioxane, or furuorinated silsesquioxane. Dielectric layer 10 may be formed to any suitable thickness using any suitable technique that may depend, for example, on the material or materials used. In the embodiment, dielectric layer 10 of BPSG is formed to about 500 nm by deposition using plasma enhanced chemical vapor deposition (PECVD) process followed by planarization using chemical-mechanical polish (CMP) process. The BPSG layer 10 includes silicon dioxide ($SiO_2$), about 4 weight % boron, and 4 weight % phosphorous. Temperature during this PECVD process is at approximately 400° C., which is lower than the temperature range from 600° C. to 800° C. during LPCVD for deposition of silicon nitride layer 9. This temperature difference between the two deposition processes effectively maintains tensile stress created within silicon nitride layer 9. Because of higher temperature for deposition of silicon nitride layer 9 and lower temperature for deposition of dielectric layer 10, tensile stress of silicon nitride layer 9 is maintained. It will be appreciated that dielectric layer 10 functions to maintain tensile stress created within silicon nitride layer 9.

The tensile stress maintained within silicon nitride layer 9 has effects on underlying structure, which will be described later. Before describing further on tensile stress within silicon nitride layer 9, a local interconnect formation process using silicon nitride layer 9 as an etch-stop layer is described below with reference to FIGS. 2A, 2B and 2C.

Figure 2A:
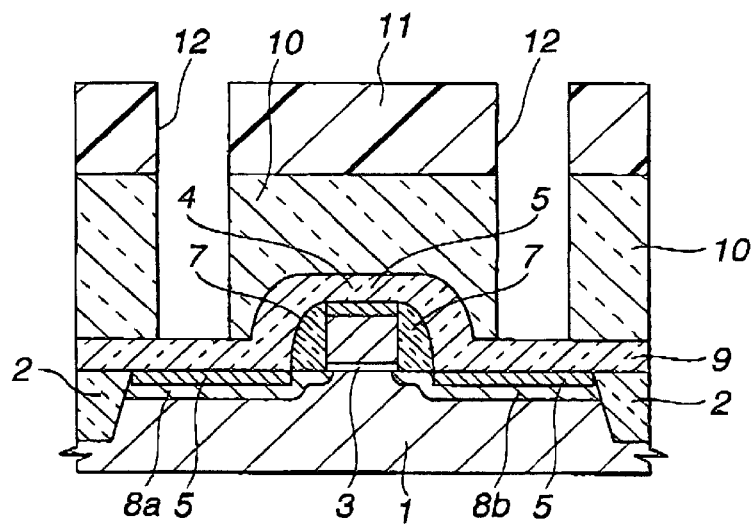
FIGS. 2A to 2C depict the portion of FIG. 1C following the formation of local interconnects that extend through the dielectric layer and the silicon nitride layer.

In FIG. 2A, dielectric layer 10 has been planarized using CMP process. A patterned resist mask 11 formed with etch-openings 12 has been coated over top of dielectric layer 10. Dielectric layer 10 exposed by patterned resist mask 11 has been dry-etched within a reactive ion etching (RIE) etcher. Selective portions of dielectric layer 10 have been removed from below etch-openings 12. In the RIE etcher, feed gas including octaflourobutene ($C_4F_8$) argon (Ar) and oxygen ($O_2$) has been used. The etching process has been stopped at silicon nitride layer 9.

Figure 2B:
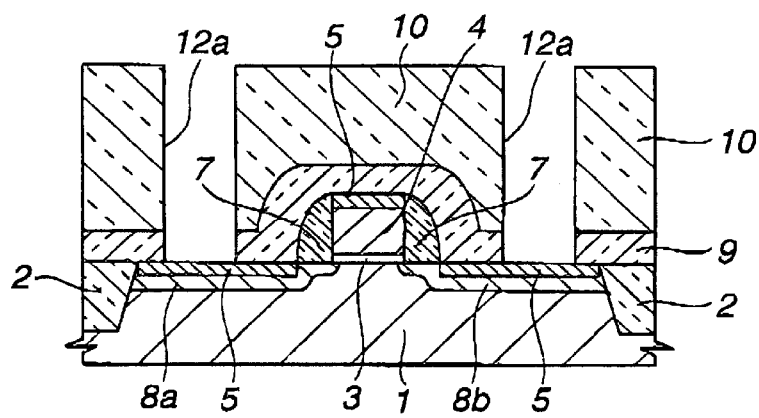

In FIG. 2B, selective portions of silicon nitride layer 9 have been dry-etched from below etch-openings 12 within the same RIE etcher using new feed gas including Freon® ($CHF_3$). Contact holes 12a have been created through dielectric layer 10 and silicon nitride layer 9. The underlying silicide layer 5 of cobalt silicide is not damaged during the etching process, thus protecting underlying structure including source and drain regions 8a and 8b. In this etching process, the selectivity, i.e., the ratio between (etch rate of silicon nitride layer 9) and (etch rate of cobalt silicide layer 5) exceeds 50.

Figure 2C:
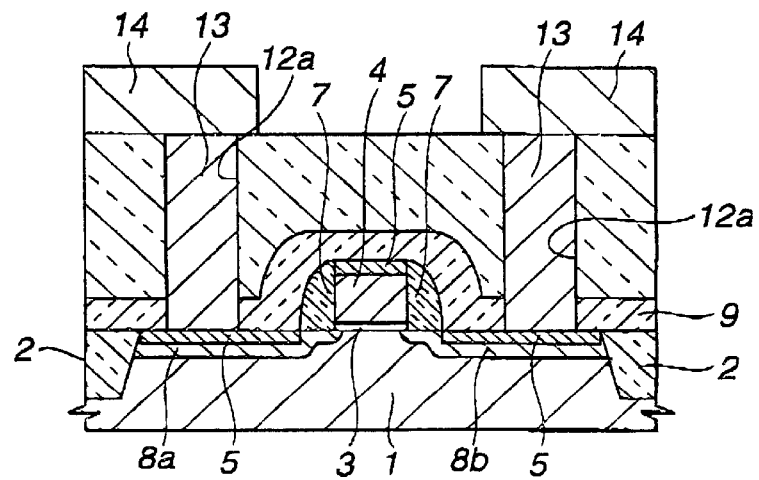

In FIG. 2C, one or mode conductive materials including tungsten (W) have been deposited to form contact plugs 13 within the etched contact holes 12a created through dielectric layer 10 and silicon nitride layer 9. Contact plugs 13 make electrical connections with metal regions 14 formed on dielectric layer 10. In the embodiment, contact holes 12a are created and contact plugs 13 are deposited to make electrical contacts with source and drain regions 8a and 8b, respectively. In another exemplary embodiment of the present invention, a contact hole may be created through dielectric layer 10 and silicon nitride layer 9 to expose silicide layer 5 of gate 6 and a contact plug may be deposited within such contact hole to make electrical contact with the gate 6.

Figure 9:
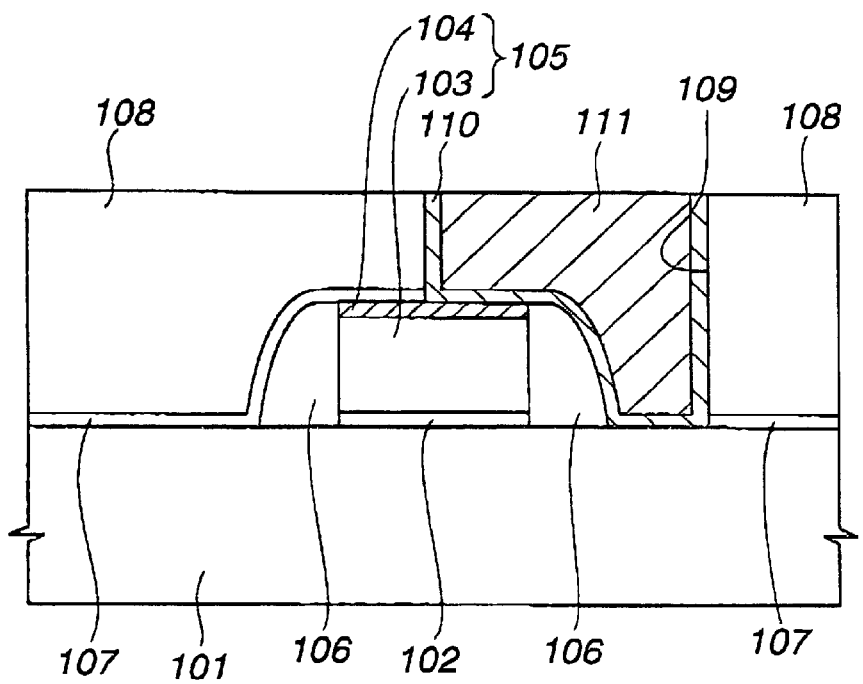
FIG. 9 depicts a cross-section of a portion of a semiconductor wafer according to a first comparative example.
Figure 10A:
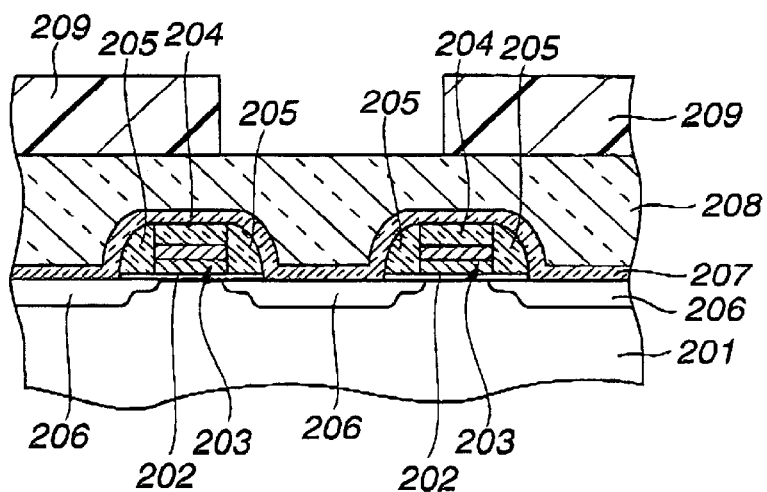
FIGS. 10A to 10C depicts a cross section of a portion of a semiconductor wafer according to a second comparative example.
Figure 10B:
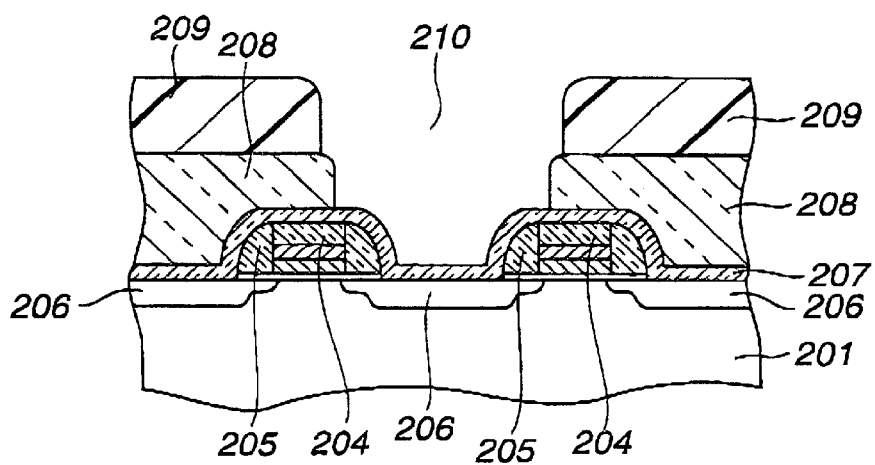
Figure 10C:
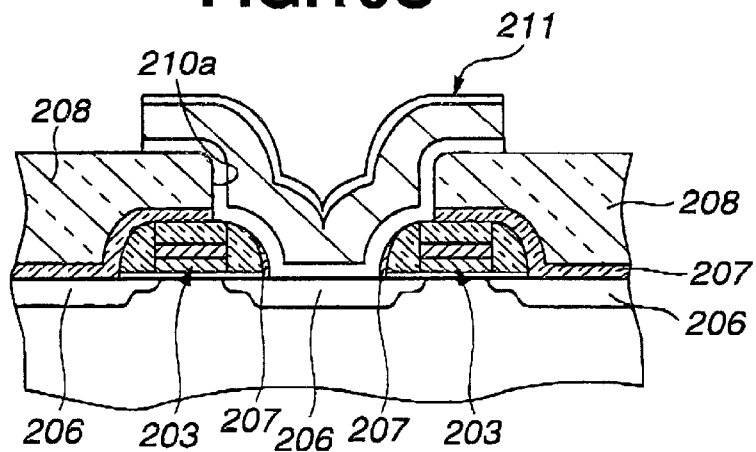

In order to consider the performance of a NMOSFET fabricated according to the embodiment of the present invention (see FIGS. 1A–1C and 2A–2C), two comparative examples, namely, first and second comparative examples, have been prepared. With reference to FIG. 9, the first comparative example will now be described. With reference to FIGS. 10A–10C, the second comparative example will be later escribed.

With reference to FIG. 9, the first comparative example will now be described.

FIG. 9 depicts a cross-section of a portion of a semiconductor wafer having a silicon nitride layer 107 and a dielectric layer 108 as prepared for local interconnect processing. The portion includes a silicon substrate 101. The portion also includes a gate 105 that is part of a NMOSFET having a source region and a drain region (not shown) formed within substrate 101. Gate 105 includes a polycrystalline silicon layer 103 formed on a gate oxide layer 102 that has been formed on substrate 101. Gate 105 also includes a conductive silicide 104 formed on top of polysilicon layer 103. Oxide spacers 106 have been added to the vertical side surfaces or walls of gate 105.

Silicon nitride layer 107 is deposited over the wafer to the thickness of approximately 50 nm at approximately 480° C. in a plasma enhanced chemical vapor deposition (PECVD) system using silane ($SiH_4$), nitrous oxide ($N_2O$) and nitrogen ($N_2$). Dielectric layer 108 was a conformal layer of tetraethlorthosilicate (TEOS). The exposed top surface of dielectric layer 108 has been planarized down, using CMP process.

Although not shown, a patterned resist mask with an etch-opening has been formed on top surface of dielectric layer 108. A local interconnect has been formed using damascene techniques wherein materials of dielectric layer 108 and silicon nitride layer 107 have been removed from below the etch-opening using a plasma etching process. Glue layer 110 and plug 111 are deposited within the etched opening 109 created through dielectric layer 108 and silicon nitride layer 107 to make electrical contact with underlying structure.

With reference to FIGS. 10A–10C, the second comparative example will now be described.

FIG. 10A depicts a cross-section of a portion of a semiconductor wafer having a silicon nitride layer 207 and a dielectric layer 208 as prepared for local interconnect processing. The portion includes a silicon substrate 201. The portion also includes gates 203, each of which is part of a MOS having a source/drain region 206 formed within substrate 201. Source/drain region 206 has an LDD structure. Gate 203 includes a tungsten polysilicide layer formed on a gate oxide layer 202 that has been formed on substrate 201. Gate 203 also includes an offset oxide 204 formed on top of the tungsten polysilicide. Oxide spacers 205 have been added to the vertical side surfaces or walls of gates 203. Offset oxide 204 of each gate 203 is a film of silicon dioxide ($SiO_2$). Oxide spaces 205 are made of silicon dioxide ($SiO_2$).

Silicon nitride layer 207 is deposited over the wafer to the thickness of approximately 50 nm at temperature ranging from 750° C. to 800° C. by low pressure chemical vapor deposition (LPCVD) process using ammonia ($NH_3$) and silane ($SiH_4$) or dichlorosilane ($SiH_2Cl_2$). Molecular nitrogen ($N_2$) is used as carrier gas. Pressure ranges from 10 Pa to 100 Pa. Time required to deposit silicon nitride to a thickness of 50 nm using LPCVD process is approximately one hour. Dielectric layer 208 was a conformal layer of silicon dioxide ($SiO_2$). The exposed top surface of dielectric layer 108 has been planarized down, using CMP process.

In FIG. 10B, a patterned resist mask with an etch-opening 210 has been formed on top surface of dielectric layer 208. Material of dielectric layer 208 has been removed from below etch-opening 210 using a plasma etching process. During this etching process, silicon nitride layer 207 protects underlying structure.

In FIG. 10C, material of silicon nitride layer 207 has been removed from below the etch-opening 210 using a plasma etching process. Plug 211 is deposited within the etched opening 210a created through dielectric layer 208 and silicon nitride layer 207 to make electrical contact with underlying structure.

Figure 11:
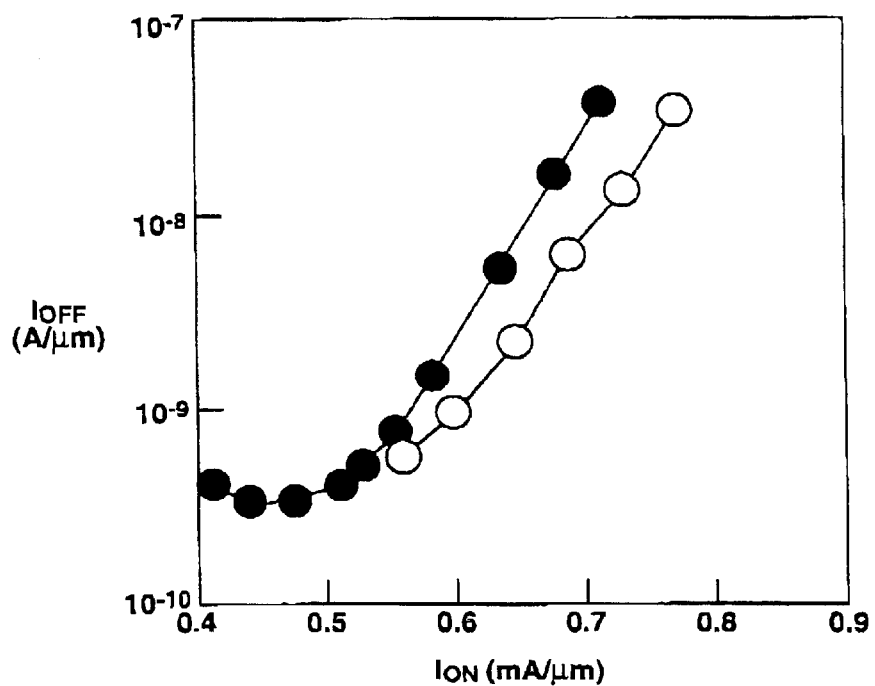
FIG. 11 depicts ON drive current against OFF current characteristic of n-channel metal-oxide-semiconductor field effect transistor according to the first comparative example.

Varying of performance of a NMOSFET with different deposition techniques of a silicon nitride layer are considered with respect to the first comparative example, second comparative example, and embodiment of the present invention, First, consider performance of a NMOSFET, which has a silicon nitride layer 107, according to the first comparative example. As mentioned before, the silicon nitride layer 107 is deposited over the NMOSFET at approximately 480° C. using PECVD process. FIG. 11 summarizes the performance by showing ON drive current $I_{ON}$ against OFF current $I_{OFF}$ for the NMOSFET according to the first comparative example as well as a NMOSFET not covered by a silicon nitride layer. In FIG. 11, black circles represent experimental data for the NMOSFET according to the first comparative example, and white circles experimental data for the NMOSFET not covered by the silicon nitride layer. The experimental data were obtained by measuring ON drive current and OFF current. ON current was measured under the following conditions: gate voltage Vg=0 V, drain voltage Vd=1.5 V, and source voltage Vs=0 V. OFF current was measured under the following conditions: Vg=Vd=1.5 V and Vs=0 V. FIG. 11 plots the experimental data for different gate lengths Lg. Ten different gate lengths are selected. Some of them are chosen to look into varying of ON current over a range in gate length Lg from 0.08 μm to 0.2 μm, and the other chosen to look into varying of ON current with different gate lengths exceeding this range beyond 0.2 μm. In FIG. 11, the experimental data represented by white circles clearly indicate increasing trend of ON current as the gate length Lg decreases. The same increasing trend of ON current arises from the experimental date represented by black circles as long as the gate length Lg is not less than a certain value. But, different increasing trend of ON current is seen as the gate length Lg becomes less than this certain value. It has been confirmed that this certain value is 0.3 μm. Over the gate lengths Lg less than 0.3 μm, with the same gate length, the NMOSFET according to the first comparative example has lower ON current than ON current of the NMOSFET without silicon nitride layer. This means that the NMOSFET according to the first comparative example exhibits poor performance over the gate lengths less than 0.3 μm. The inventor of this application considers that this poor performance arises from reduced mobility of electrons due to compressive stress created within silicon nitride layer that has been deposited in PECVD process according to the first comparative example.

Figure 3:
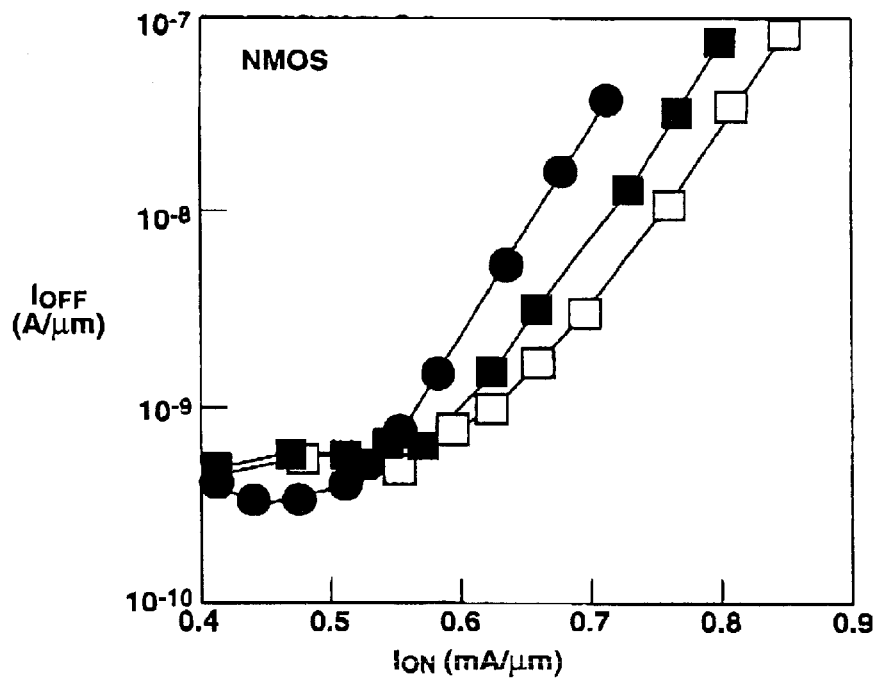
FIG. 3 depicts ON drive current against OFF current characteristic of n-channel metal-oxide-semiconductor field effect transistor.

Second, consider also performance of a NMOSFET, which has a silicon nitride layer 207, according to the second comparative example and that of a NMOSFET, which has a silicon nitride layer 9, according to the embodiment of the present invention. As mentioned before in the second comparative example depicted by FIG. 10A, silicon nitride layer 207 is deposited over the NMOSFET to the thickness of approximately 50 nm at temperature ranging from 750° C. to 800° C. and at pressure ranging from 10 Pa to 100 Pa using LPCVD process. As mentioned before in the embodiment of the present invention, silicon nitride layer 9 is deposited over the NMOSFET at temperature ranging from 600° C. to 800° C. and at pressure ranging from $1\times10^4$ Pa to $6\times10^4$ Pa using PECVD process. Similarly to FIG. 11, FIG. 3 summarizes the effect by showing ON current $I_{ON}$ against OFF current $I_{OFF}$ for the NMOSFET according to the second comparative example and for the NMOSFET according to the embodiment of the present invention. In FIG. 3, black squares represent experimental data for the NMOSFET according to the second comparative example, and white squares experimental data for NMOSFET according to the embodiment of the present invention. Throughout FIGS. 3 and 11, black circles represent the same experimental data for the NMOSFET according to the first comparative example. The experimental data shown in FIGS. 3 and 11 were obtained by measuring ON current and OFF current in the same manner. In FIG. 3, the experimental data represented by white squares clearly indicate that, with the same gate length Lg, ON current $I_{ON}$ of the NMOSFET according to the embodiment of the present invention is higher than those of NMOSFETs according to the first and second comparative examples. This means that the NMOSFET according to the embodiment of the present invention exhibits good performance over almost all of the gate lengths selected to obtain the experimental data. The inventor considers that this good performance exhibited by the NMOSFET according to the embodiment of the present invention arises from enhanced mobility of electrons due to tensile stress created within silicon nitride layer that has been deposited in high pressure LPCVD process according to the embodiment of the present invention.

Figure 4:
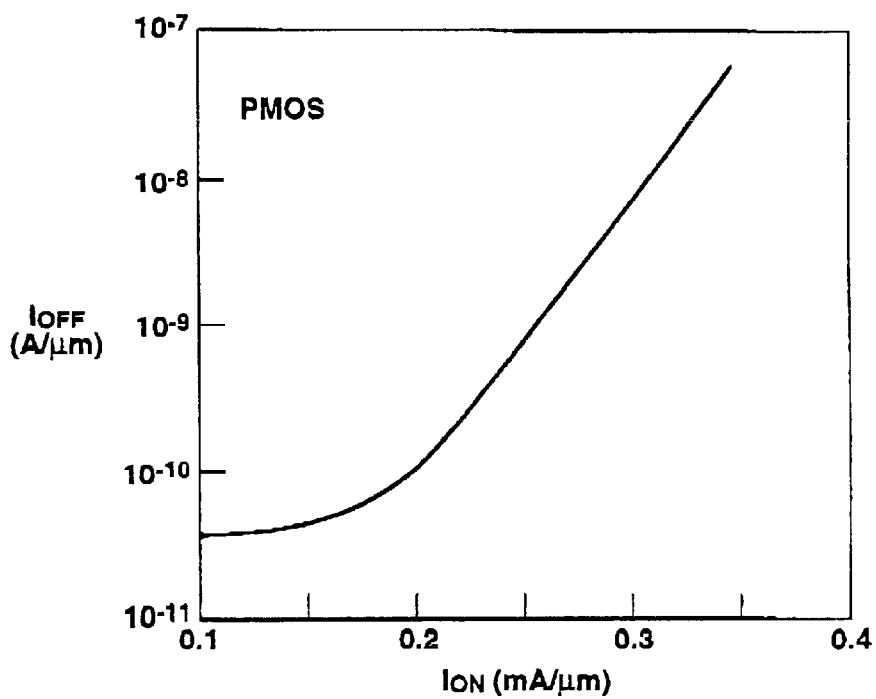
FIG. 4 depicts ON drive current against OFF current characteristic of p-channel metal-oxide-semiconductor field effect transistor.

The preceding description has clarified that electron mobility within a NMOSFET is dependent on stress created within overlying silicon nitride layer. Further description on the stress dependent mobility of electrons will be further described later with reference to FIGS. 5 and 6. Before mating such description, consider a PMOSFET wherein holes carry charges. As is well known, hole mobility is lower than electron mobility. Besides, hole mobility is far less dependent on stress created with overlying silicon nitride layer than electron mobility is. FIG. 4 shows ON drive current ION against OFF current $I_{OFF}$, which is common to three different PMOSFETs, one according to the first comparative example, another according to the second comparative example, and the other according to the embodiment of the present invention. Accordingly, there is no or little varying of ON current with the different PMOSFETs.

Figure 5:
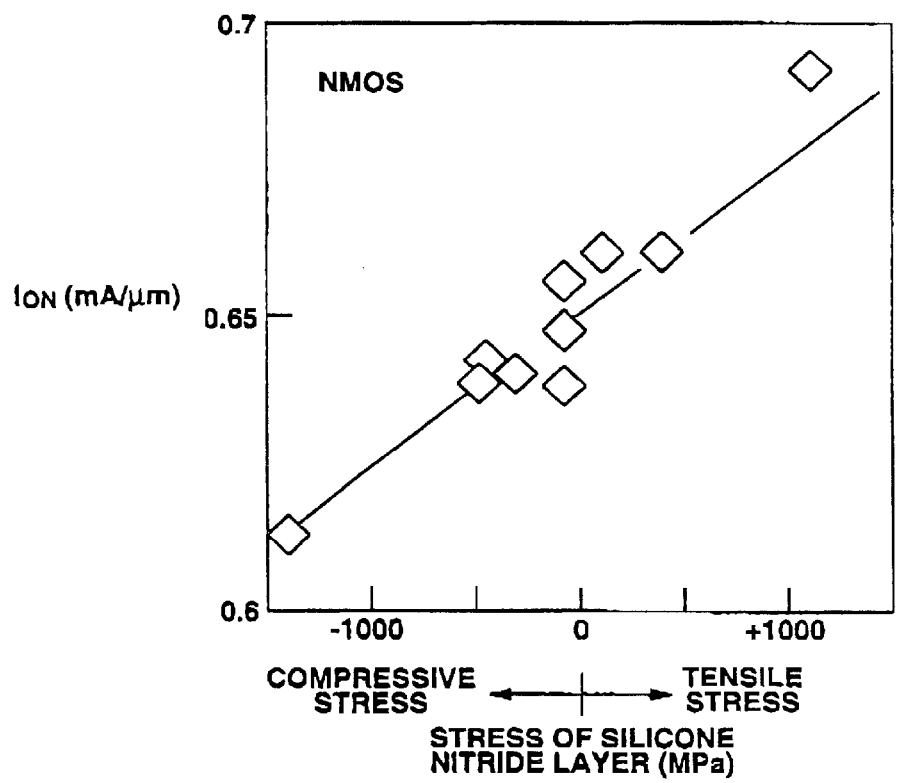
FIG. 5 depicts the varying of ON drive current with different stress within overlying silicon nitride layer.

ON drive current ION of NMOSFET depends on stress created within overlying silicon nitride layer. FIG. 5 shows the relationship between ON current $I_{ON}$ and stress created within overlying silicon nitride layer. White squares represent experimental data of ON current $I_{ON}$ measured under the same conditions as in FIG. 3 when OFF current $I_{OFF}$ is 5 nA/$\mu$m (=5×10$^{-9}$ A/$\mu$m). FIG. 5 states increasing trend of ON current as tensile stress within overlying silicon nitride layer increases. Noticeable increase of ON current is seen when the tensile stress is approximately 1000 MPa (=10$^{10}$ dyn/cm$^2$).

Figure 6:
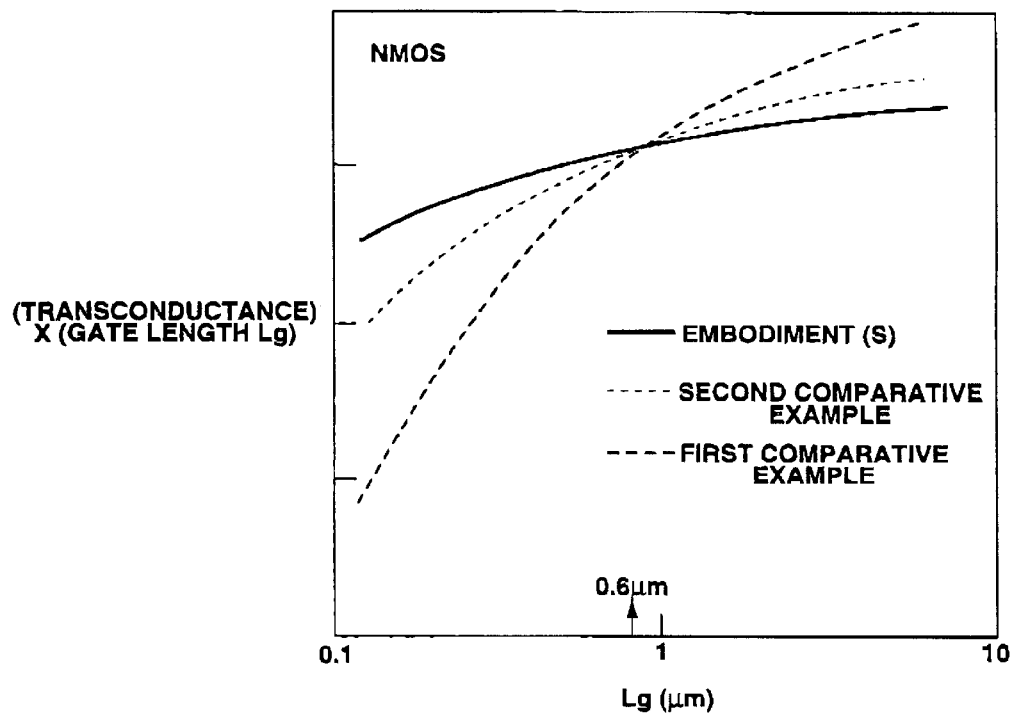
FIG. 6 depicts the varying of [(transconductance)×(gate length Lg)] with different gate lengths.

Increasing of ON current within a NMOSEFT depends on gate length Lg. In FIG. 6, the fully drawn line shows the varying of [(transconductance)×(gate length Lg)] with different gate lengths Lg with respect to a NMOSFET according to the embodiment of the present invention. The bold dashed line shows the varying of [(transconductance)×(gate length Lg)] with different gate lengths Lg with respect to a NMOSFET according to the first comparative example. The normal dashed line shows the varying of [(transconductance)×(gate length Lg)] with different gate lengths Lg with respect to a NMOSFET according to the second comparative example.

FIG. 6 clearly states that, when the gate length Lg is less than a threshold value of 0.6 $\mu$m, with the same gate length, [(transconductance)×(gate length Lg)] according to the embodiment of the present invention is greater than that according to the second comparative example, which is greater than that according to the first comparative example. This means that the NMOSFET according to the embodiment of the present invention exhibits the best performance when the gate length Lg is less than the threshold value of 0.6 $\mu$m.

FIG. 6 also states that, when the gate length Lg is not less than the threshold value of 0.6 $\mu$m, with the same gate length, [(transconductance)×(gate length Lg)] according to the embodiment of the present invention is less than that according to the second comparative example, which is less than that according to the first comparative example.

The inventor considers that the above-mentioned inversion of the relationship across the threshold value of 0.6 $\mu$m is due to the degree to which stress applied to the edges of channel affects electron mobility within NMOSFET. According to the embodiment of the present invention, a silicon nitride layer deposited over a wafer coats the top and side surfaces of a gate of a NMOSFET having source/drain regions separated by channel below the gate. The deposited silicon nitride has tensile stress, creating a vertical force component urging the gate against the channel to generate compressive stress therein as well as horizontal force components applied to the edges of the channel to generate tensile stress therein. The compressive stress within the channel becomes predominant when the gate length is large. The tensile stress within the channel becomes predominant when the gate length becomes less than 0.6 $\mu$m. The inventor considers that electron mobility increases as the tensile stress within the channel becomes predominant. If the compressive stress within the channel becomes predominant, electron mobility is hampered.

Figure 7A:
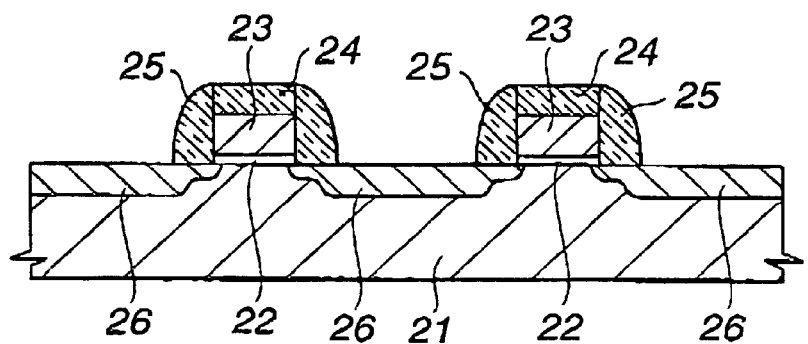
FIGS. 7A to 7C depict a cross section of a portion of a semiconductor wafer during the formation of a silicon nitride layer using an enhanced deposition control and then an overlying dielectric layer.
Figure 7B:
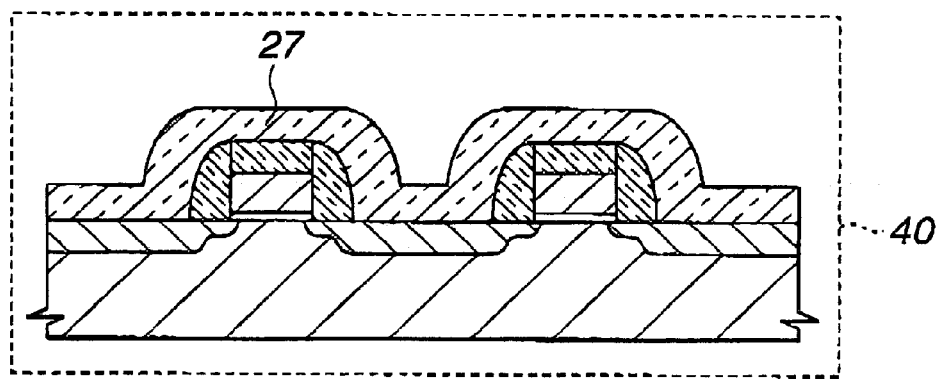
Figure 7C:
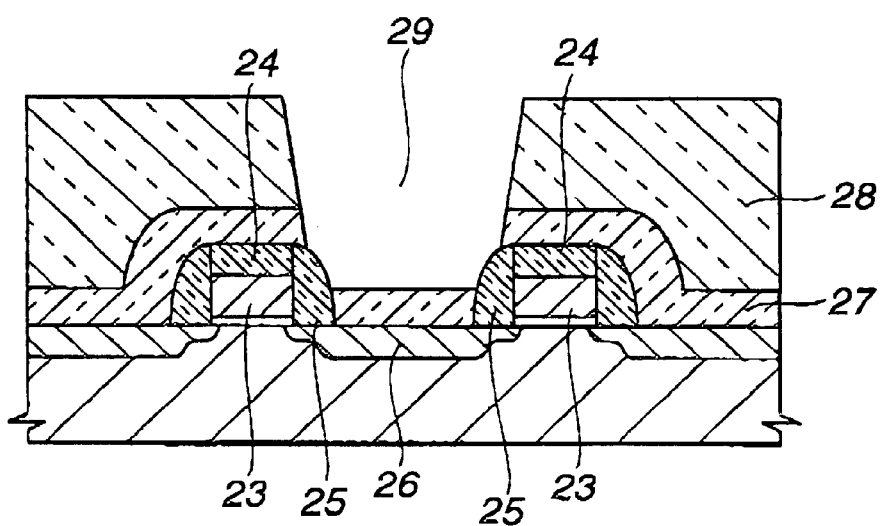

With reference to FIGS. 7A–7C, another exemplary embodiment according to the present invention is described. This exemplary embodiment is substantially the same as the first exemplary embodiment as depicted in FIGS. 1A–1C in deposition of a silicon nitride layer 27 (see FIG. 7B). Silicon nitride layers 27 (FIG. 7B) and 9 (FIG. 1B) are the same in the manner of deposition and composition. Further, silicon nitride layer 27 acts as an etch-stop layer in the same manner as silicon nitride layer 9 does.

FIG. 7A depicts a cross-section of a portion of a semiconductor wafer before forming dual-layer dielectric including silicon nitride layer 27. The portion includes a silicon substrate 21 in which one or more devices have been formed. The portion also includes gates 23, each of which is part of a MOS having a source/drain region 26 formed within substrate 21. Source/drain region 26 has an LDD structure. Gate 23 includes a doped tungsten polysilicide layer formed on a gate oxide layer 22 that has been formed on substrate 21. Gate 23 also includes a cap oxide 24 formed on top of the tungsten polysilicide. Oxide spacers 25 have been added to the vertical side surfaces or walls of gates 23.

FIG. 7B depicts an exemplary cross-section of an improved portion of semiconductor during the deposition of silicon nitride layer 27. Silicon nitride layer 27 is a thin film of silicon nitride that is approximately 50 nm thick. Silicon nitride layer 27 is deposited within a reactor chamber 40 at temperature ranging from 600° C. to 800° C. by LPCVD process using ammonia (NH$_3$) and silane (SiH$_4$). Molecular nitrogen (N$_2$) is used as carrier gas. Pressure ranges from 1×10$^4$ Pa to 6×10$^4$ Pa. Time required to deposit silicon nitride to a thickness of 50 nm is approximately is less than one minute.

With reference to FIG. 7C, after depositing a conformal dielectric layer 28 to a thickness of 500 nm, the exposed top surface of the dielectric layer has been planarized down, using CMP process. Temperature during this deposition is at approximately 500° C. Although not shown, a patterned resist mask with an etch-opening has been formed on top surface of dielectric layer 28. Material of dielectric layer 28 has been removed from below the etch-opening using dry etching process. In the dry etching process, feed gas including octaflourobutene ($C_4F_8$), argon (Ar) and oxygen ($O_2$) has been used. During this etching process, silicon nitride layer 27 protects underlying structure. The selectivity, i.e., the ratio between (etch rate of dielectric layer 28) and (etch rate of silicon nitride layer 27), is at approximately 30. Material of silicon nitride layer 27 has been removed from below from below the etch-opening in dry etching process using feed gas including nitrogen trifluoride ($NF_3$) and carbon monoxide (CO). Contact hole 29 has been created through dielectric layer 28 and silicon nitride layer 27. Although not shown, plug will be deposited within contact hole to make electric contact with underlying structure.

Silicon nitride layer 9 or 27 deposited according to the embodiments of the present invention is porous and has sufficiently large number of pores to allow hydrogen to pass toward underlying structure during hydrogen anneal. Silicon nitride layer 207, deposited using a conventional LPCVD process described as the second comparative example (see FIGS. 10A–10C), is condensed and thus less porous.

In this conventional LPCVD process, the doped polysilicon layer of each gate 203 is exposed to temperature of approximately 750° C. over 1 hour until silicon nitride layer 207 is deposited to a thickness of 50 nm. Due to this long exposure time to high temperature, a portion of doped impurity within the polysilicon layer is deactivated, causing an appreciable drop in concentration of activated impurity. This drop in concentration of activated impurity creates depletion within the polysilicon of gate 203. In the deposition process according to the embodiments of the present invention, exposure time of polysilicon layer of gate 6 (see FIG. 1A) or 23 (see FIG. 7A) is very short and less than 1 minute. The drop in concentration of activated impurity and thus creation of depletion within the polysilicon are suppressed completely or at least to satisfactorily low level.

Figure 8:
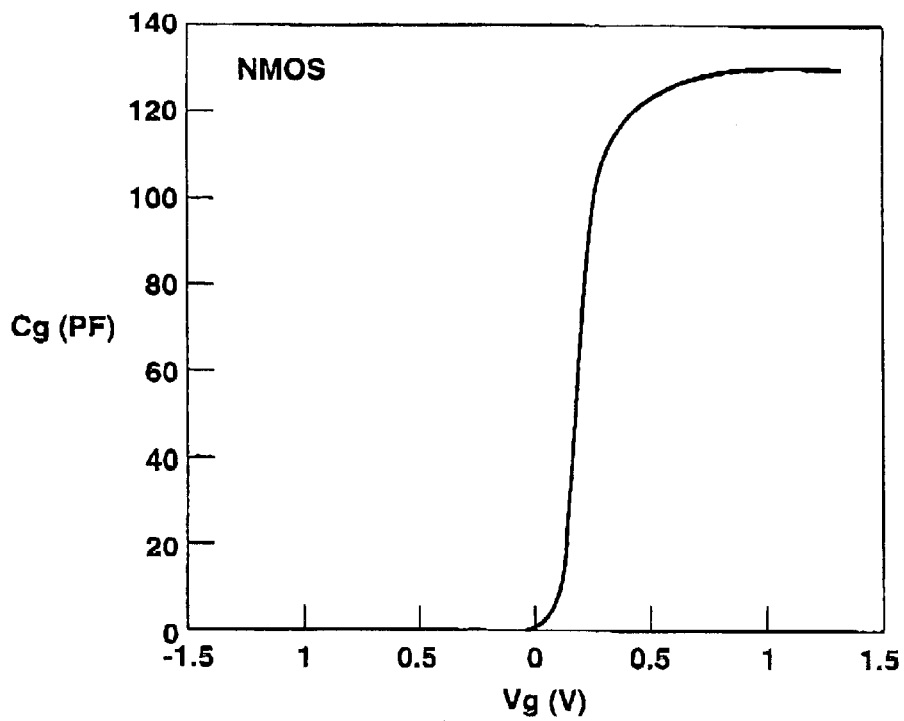
FIG. 8 depicts the varying of gate capacitance with different gate voltages for a n-channel metal-oxide-semiconductor field effect transistor without the silicon nitride layer.
Figure 12:
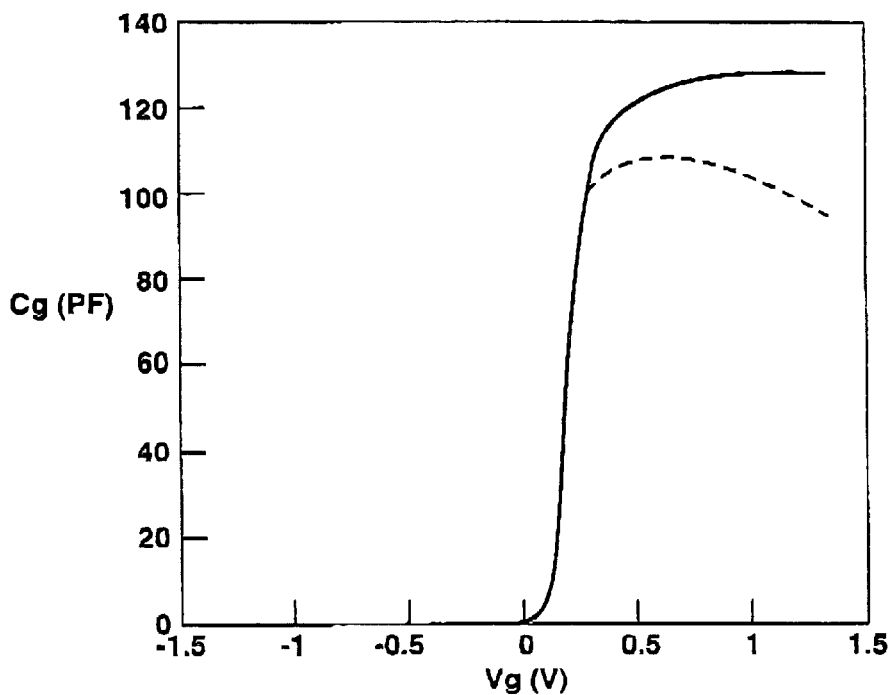
FIG. 12 depicts the varying of gate capacitance with different gate voltages for a n-channel metal-oxide-semiconductor field effect transistor according to the second comparative example.

The presence of depletion in the gate has effect on the performance of NMOSFET and PMOSFET formed within a semiconductor wafer. FIG. 12 summarizes the effect by showing the varying of gate capacitance Cg with different gate voltages Vg. A NMOSFET has been considered, which has a gate, measuring 100 $\mu$m×100 $\mu$m, formed on an oxynitride layer of 2 nm thick that has been formed on a silicon substrate. First test sample has been fabricated according to the second comparative example with reference to FIGS. 10A–10C. Second test sample has been fabricated without such silicon nitride layer. FIG. 8 depicts the varying of gate capacitance Cg with different gate voltages Vg for the second sample. In FIG. 12, the dashed line shows the varying of gate capacitance Cg with different gate voltages Vg for the first test sample, while the fully drawn line shows the varying of gate capacitance Cg shown in FIG. 8. From FIG. 12, it will be appreciated that there is a considerable deviation in gate capacitance cg if gate voltage exceeds 0.5 V. This deviation is due to the presence of depletion within the gate of the first test sample. Third test sample has been fabricated employing the deposition process of silicon nitride layer according the embodiments of the present invention. FIG. 8 shows the varying of gate capacitance Cg with different gate voltages Vg for the third test sample. The fully drawn line in FIG. 8 is analogous to the fully drawn line of FIG. 12, meaning that there is no depletion in the gate of the third sample fabricated according to the embodiments of the present invention. Accordingly, there is no undesired deviation if the gate voltage exceeds 0.5 V.

In the exemplary embodiments of the present invention, the reactants including silane ($SiH_4$) and ammonia ($NH_3$) are applied to reactor chamber 40 for deposition of silicon nitride layer 9. In another embodiment of the present invention, fluorosilane ($SiH_xF_{4-x}$) is used instead of silane ($SiH_4$), where: x=0, 1, 2, 3 or 4. In this embodiment, the reactants including fluorosilane ($SiH_xF_{4-x}$) and ammonia ($NH_3$) are applied by a flow into chamber 40. Molecular nitrogen ($N_2$) is used as carrier gas. Instead of molecular nitrogen ($N_2$), other inert gas, such as, helium (He) and argon (Ar) may be used as carrier gas.

In further embodiment of the present invention, disilane ($Si_2H_6$) is used instead of silane ($SiH_4$). In this case, the deposition temperature should be maintained lower than 600° C. In still further embodiment of the present invention, dichlorosilane ($SiH_2Cl_2$) is used instead of silane ($SiH_4$).

In exemplary embodiments according to the present invention, suitable pressures, within reactor chamber 40, range from $1 \times 10^4$ Pa to $6 \times 10^4$ Pa. This pressure range is currently appropriate. If the deposition pressure higher than this range is used, the variation in thickness of silicon nitride layer increases and particles occur frequently. If the deposition pressure is lower than this range, the deposition rate drops.

While the present invention has been particularly described, in conjunction with the exemplary embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for controlling deposition of a protective layer in a semiconductor device, comprising the steps of:
   forming a NMOSFET on a substrate of the semiconductor device;
   after forming the NMOSFET, depositing a silicon nitride protective layer on the NMOSFET and the substrate in a reactor at a pressure of at least approximately $10^4$ Pa and at a temperature in a range of 600° C. to 800° C.; and
   after forming the silicon nitride protective layer, depositing a dielectric layer on the silicon nitride protective layer at a predetermined temperature, which is lower than the range of temperature so as to maintain tensile stress created within the silicon nitride protective layer.

2. The method of claim 1, wherein the NMOSFET includes a gate and further comprising the step of forming on a top surface of the gate a first layer of one of a silicide layer and a silicon dioxide layer before the step of depositing the silicon nitride protective layer, and wherein the step of depositing the silicon nitride protective layer comprises the step of depositing the silicon nitride protective layer on the first layer.

3. The method of claim 1, wherein the NMOSFET includes a gate having top and side surfaces and a source and a drain in the substrate, and further comprising the step of forming a silicide layer on the top surface of the gate and on the source and drain before the step of depositing the silicon nitride protective layer, and wherein the step of depositing the silicon nitride protective layer comprises the step of depositing the silicon nitride protective layer on the silicide layer when the pressure is from $1 \times 10^4$ Pa to $6 \times 10^4$ Pa.

4. The method of claim 1, wherein the NMOSFET includes a gate having top and side surfaces, and further comprising the step of forming a silicon dioxide layer on the top and side surfaces of the gate before the step of depositing the silicon nitride protective layer, and wherein the step of depositing the silicon nitride protective layer comprises the step of depositing the silicon nitride protective layer on the silicon dioxide layer when the pressure is from $1 \times 10^4$ Pa to $6 \times 10^4$ Pa.

5. The method of claim 1, wherein the silicon nitride includes $Si_xN_y$.

6. The method as claimed in claim 1, wherein the predetermined temperature is 400° C.

7. The method as claimed in claim 1, wherein the predetermined temperature is 400° C. to 500° C.

* * * * *